(12) United States Patent
Tihanyi et al.

(10) Patent No.: US 7,148,736 B1
(45) Date of Patent: Dec. 12, 2006

(54) POWER SWITCH

(75) Inventors: Jenoe Tihanyi, Kirchheim (DE); Peter Sommer, München (DE)

(73) Assignee: Infineon Technologies AG, Munich (DE)

( * ) Notice: Subject to any disclaimer, the term of this patent is extended or adjusted under 35 U.S.C. 154(b) by 1640 days.

(21) Appl. No.: 09/590,041

(22) Filed: Jun. 8, 2000

(30) Foreign Application Priority Data

Jun. 8, 1999 (DE) ................. 199 26 109

(51) Int. Cl.
*H03K 17/60* (2006.01)
(52) U.S. Cl. .................................. 327/377
(58) Field of Classification Search ........... 327/377, 327/427, 432
See application file for complete search history.

(56) References Cited

U.S. PATENT DOCUMENTS 4,717,849 A   1/1988   Shigekane
4,746,814 A * 5/1988   Shigekane ............... 327/432
4,754,310 A   6/1988   Coe
4,945,266 A * 7/1990   Mori ....................... 327/428
5,469,047 A * 11/1995  Kumamoto et al. ...... 323/312

FOREIGN PATENT DOCUMENTS

DE   1 135 040        8/1962
EP   0 585 788 A1     3/1994
JP      05029904 A *  2/1993

* cited by examiner

*Primary Examiner*—Adolf Berhane
(74) *Attorney, Agent, or Firm*—Laurence A. Greenberg; Werner H. Stemer; Ralph E. Locher

(57) ABSTRACT

The power switch has a first transistor, a limiting transistor, and an auxiliary transistor. The first transistor has a load path and a control electrode. The limiting transistor, which limits a voltage drop across the load path of the first transistor, has a load path connected in series with the load path of the first transistor, and a control electrode. The auxiliary transistor has a load path connected between the control electrode of the limiting transistor and a reference node, and having a control electrode connected between the first transistor and the limiting transistor.

10 Claims, 2 Drawing Sheets

POWER SWITCH

BACKGROUND OF THE INVENTION

Field of the Invention

The present invention lies in the electronics and electrical engineering fields. More specifically, the invention relates to a power switch having the following features:
a first transistor having a load path and a control electrode;
a first limiting transistor for limiting a voltage drop across the load path of the first transistor, having a load path connected in series with the load path of the first transistor, and having a control electrode.

A power switch of this type is disclosed in U.S. Pat. No. 5,285,369 to Balakrishnan (see European published patent application EP 0 585 788 A1). There, the first transistor is MOSFET whose load path (drain-source path) is connected in series with the load path of a junction field-effect transistor, also referred to as called junction FET (JFET). The source electrode of the MOSFET and the gate electrode of the JFET are in this case connected to a common node. The JFET is in the on state when the MOSFET is in the on state. If the MOSFET is turned off when a corresponding potential is applied to its gate electrode, the JFET is initially still in the on state. The drain potential of the MOSFET and the source potential of the JFET rise until the gate-source voltage of the JFET reaches the value of the reverse voltage. The JFET turns off and thereby limits a further voltage rise across the load path of the MOSFET, in order to protect the latter against being destroyed by overvoltage.

In the prior art power switch, the value of the voltage obtained across the load path of the MOSFET is limited to the value of the reverse voltage of the JFET. The maximum permissible voltage which can be switched non-destructively through the power switch is given by the sum of the maximum load path voltages of the JFET and of the MOSFET.

SUMMARY OF THE INVENTION

It is accordingly an object of the invention to provide a power switch, which overcomes the disadvantages of the heretofore-known devices and methods of this general type.

With the foregoing and other objects in view there is provided, in accordance with the invention, a power switch, comprising:
a controllable transistor having a load path and a control electrode;
a limiting transistor for limiting a voltage drop across the load path of the first transistor, the limiting transistor having a load path connected in series with the load path of the first transistor, and having a control electrode; and
an auxiliary transistor having a load path connected between the control electrode of the limiting transistor and a reference node, and having a control electrode connected between the first transistor and the limiting transistor.

In contrast with the prior art, therefore, the power switch according to the invention has a first auxiliary transistor with a load path connected between the control electrode of the first limiting transistor and a reference node, and a control electrode connected between the first transistor and the first limiting transistor.

The auxiliary transistor of the power switch according to the invention, which is preferably a junction field-effect transistor of a complementary conductivity type with respect to the conductivity type of the limiting transistor, serves, when the first transistor is turned off, for setting a gate potential of the first limiting transistor which lies above the potential of the reference node. As a result, until the limiting transistor is turned off, a higher voltage can be dropped across the load path of the first transistor than is prescribed by the reverse voltage of the limiting transistor according to the prior art. In order to limit the gate potential of the first limiting transistor, a Zener diode is advantageously connected in parallel with the load path of the first auxiliary transistor, which diode turns on when its breakdown voltage is reached.

In accordance with an added feature of the invention, at least one further limiting transistor has a load path connected in series with the load path of the first above-mentioned limiting transistor, and at least one further auxiliary transistor has a load path connected between the control electrode of the first-mentioned limiting transistor and the control electrode of the second limiting transistor, and a control electrode connected between the load paths of the first and further limiting transistors. Zener diodes are advantageously connected in parallel with the auxiliary transistors.

The addition of further limiting transistors whose load paths are each connected in series, and to whose control electrodes respective auxiliary transistors are connected for the purpose of setting a control electrode potential of the limiting transistors, makes it possible advantageously to increase the maximum voltage that can be switched through the power switch, without risking the destruction of the first transistor and of the limiting transistors. In this case, the first transistor and the limiting transistors each accept a portion of the voltage dropped across the load path of the power switch, the first transistor and the limiting transistors preferably being dimensioned in such a way that they can accept only a portion of the maximum total voltage without being destroyed.

The distribution of the total voltage between a plurality of transistors has a beneficial effect on the resistance of the power switch in the on state. For transistors, it holds true that said resistance rises exponentially with the maximum permissible load path voltage for the transistor. If the number of series-connected transistors used is fixedly prescribed, then in the case of such a circuit in which the transistors are designed each to accept a specific portion of the total voltage, the resistance is exponentially dependent on the maximum permissible total voltage. By contrast, the invention makes it possible, independently of the maximum permissible total voltage of the power switch, always to use transistors having the same maximum load path voltage and to vary the number of series-connected transistors. The dielectric strength of the power switch rises with each transistor by a value prescribed by the dielectric strength of the individual transistor. At the same time, the resistance of the power switch rises by a value prescribed by the resistance of the individual transistor. The resistance thus rises proportionally to the dielectric strength, not exponentially with respect thereto.

In accordance with an additional feature of the invention, the load path of the controlled transistor is connected between the limiting transistor and the reference node. In other words, that load path terminal of the first transistor which is remote from the first limiting transistor is connected to the reference node.

In accordance with another feature of the invention, a power switch control terminal is connected to the control electrode of the controllable transistor.

In accordance with a further feature of the invention, the limiting transistor has a source electrode and a gate electrode, and a Zener diode is connected between the source electrode and the gate electrode of the limiting transistor.

In the cascaded switch embodiment, a Zener diode is connected between the source electrode and the gate electrode of each limiting transistor.

In accordance with again an additional feature of the invention, a Zener diode is connected in parallel with the load path of the auxiliary transistor. In the cascaded switch embodiment, Zener diodes are connected in parallel with the load paths of each of the auxiliary transistors.

In accordance with again a further feature of the invention, the controllable transistor is a MOSFET of a first conductivity type, the limiting transistor is a normally on field-effect transistor of the first conductivity type, and the auxiliary transistor is a normally on field-effect transistor of a second conductivity type. These variants are equally true in the multi-auxiliary transistor embodiment.

In accordance with yet a further feature of the invention, the controllable transistor, the limiting transistor, and the auxiliary transistor are integrated in a semiconductor body.

With the above and other objects in view there is provided, in accordance with the invention, a semiconductor body with a power switch formed in the semiconductor body and having a load path running vertically through the semiconductor body. The semiconductor body comprises:

a substrate doped with charge carriers of a first conductivity type;

at least one well doped with charge carriers of a second conductivity type, and a MOSFET formed in the at least one well;

a first region formed in the substrate spaced apart from the well and heavily doped with charge carriers of the first conductivity type; and a second region horizontally spaced apart from the first region and heavily doped with charge carriers of a second conductivity type.

In accordance with yet again a further feature of the invention, the first region is one of a plurality of first regions formed in the semiconductor body and spaced apart from one another in the vertical direction, and the second region is one of a plurality of second regions formed in the semiconductor body and spaced apart from one another in the vertical direction.

In accordance with a concomitant feature of the invention, interconnects connect respectively adjacent second regions, the interconnects being formed by doping with charge carriers of the second conductivity type. The well is connected to the second region by an interconnect.

Other features which are considered as characteristic for the invention are set forth in the appended claims.

Although the invention is illustrated and described herein as embodied in a power switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Unless indicated otherwise, identical reference symbols refer to functionally and structurally equivalent parts throughout the drawing figures.

DESCRIPTION OF THE PREFERRED EMBODIMENTS

Figure 1:
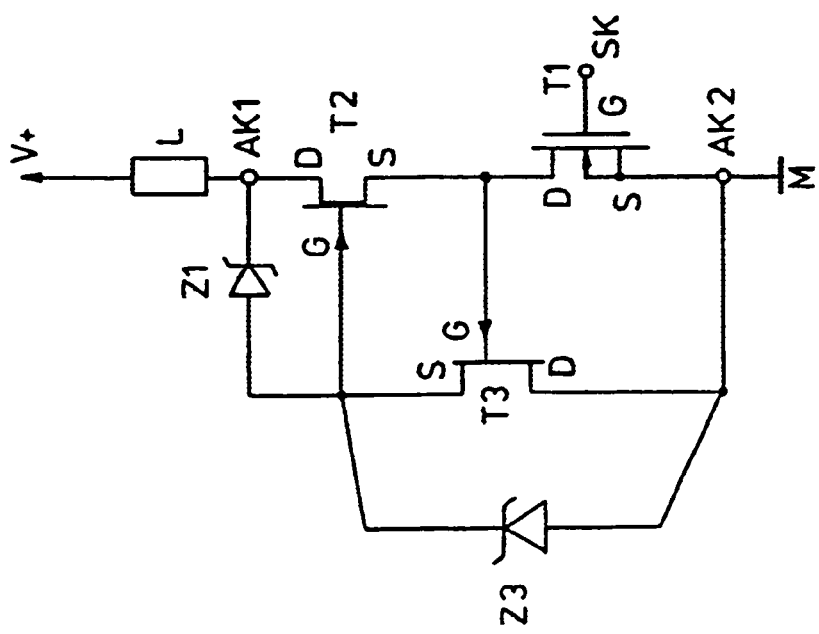
FIG. 1 is a schematic circuit diagram of a first embodiment of the power switch according to the invention.

Referring now to the figures of the drawing in detail and first, particularly, to FIG. 1 thereof, there is seen a circuit diagram of an exemplary embodiment of a power switch according to the invention.

The power switch is used to switch a voltage between a first connecting terminal AK1 and a second connecting terminal AK2. The switching is dependent on a control signal present at a control terminal SK.

The power switch has a first transistor T1, which is an n-conducting MOSFET in the exemplary embodiment, and a limiting transistor T2, which is an n-conducting junction FET in the exemplary embodiment. A load path of the MOSFET T1, which runs between the drain electrode D and the source electrode S of the latter, is connected in series with a load path of the junction FET T2, which runs between the drain electrode D and the source electrode S of the latter, the drain terminal D of the MOSFET T1 being connected to the source terminal S of the junction FET T2. The gate electrode G of the MOSFET T1, which serves as switching element in the power switch, is connected to the control terminal SK of the power switch.

The limiting transistor T2 designed as a junction FET serves for limiting a voltage dropped across the load path D-S of the MOSFET T1 when the latter turns off. To that end, the junction FET T2 turns off when the drain potential of the MOSFET T1 exceeds a specific value.

In order to drive the limiting transistor T2, there is provided an auxiliary transistor T3 in the form of a p-conducting junction FET in the exemplary embodiment. The transistor T3 has a load path which runs between a source electrode S and a drain electrode D and is connected between the gate electrode G of the limiting transistor T2 and a reference node. In the exemplary embodiment, the reference node is formed by the second output terminal AK2, to which the source terminal S of the MOSFET T1 is also connected. The gate electrode G of the auxiliary transistor T3 is connected to a node which is common to the source electrode S of the limiting transistor T2 and to the drain electrode D of the MOSFET T1. The gate electrode G of the limiting transistor T2 and the source electrode S of the auxiliary transistor T3 are connected to the first connecting terminal AK1 via a first Zener diode Z1. The gate potential of the limiting transistor T2 is limited by a further Zener diode Z3 which is connected in parallel with the load path of the first auxiliary transistor T3.

In order to illustrate the function of the power switch, in the exemplary embodiment according to FIG. 1 the power switch is connected between a reference potential M and a terminal of a load L by means of the connecting terminals AK1, AK2. The load L is connected to a supply potential V+ by means of a further terminal.

When a potential that is positive with respect to the reference potential M and that suffices to switch on the MOSFET T1 is present at the control terminal SK of the power switch, and hence at the gate electrode G of the MOSFET T1, the limiting transistor T2 (as a normally-on transistor, T2 is maximally in the on state when the gate-source voltage is zero, and its conductivity decreases toward negative gate-source voltage values) turns on and the p-conducting auxiliary transistor T3, whose conductivity decreases toward positive gate-source voltage values, turns on. The power switch is "closed". Approximately the entire supply voltage is then dropped across the load L, if the load L is large with respect to the sum of the load path resistances of the MOSFET T1 and of the limiting transistor T2.

When the MOSFET T1 is turned off by reducing the potential at the control terminal SK, there is a rise in the potential at its drain electrode D and at the source electrode S of the limiting transistor T2 and the gate electrode G of the auxiliary transistor T3. The auxiliary transistor T3 starts to turn off. As a result, the gate potential of the limiting transistor T2 rises and the latter remains in the on state. The gate potential of the limiting transistor T2 and the voltage across the load path of the auxiliary transistor T3 rise until the breakdown voltage of the further Zener diode Z3 is reached and a further rise in potential is thereby prevented. With a further rise in the potential at its source electrode S, the limiting transistor T2 starts to turn off. When the gate-source voltage of the limiting transistor T2 reaches the value of the reverse voltage, the limiting transistor T2 turns off completely and thus prevents a further voltage rise across the load path of the MOSFET T1. The difference between the voltage that is present between the connecting terminals AK1, AK2 and the voltage dropped across the load path of the MOSFET T1 is accepted by the limiting transistor T2, which is dimensioned accordingly.

Figure 2:
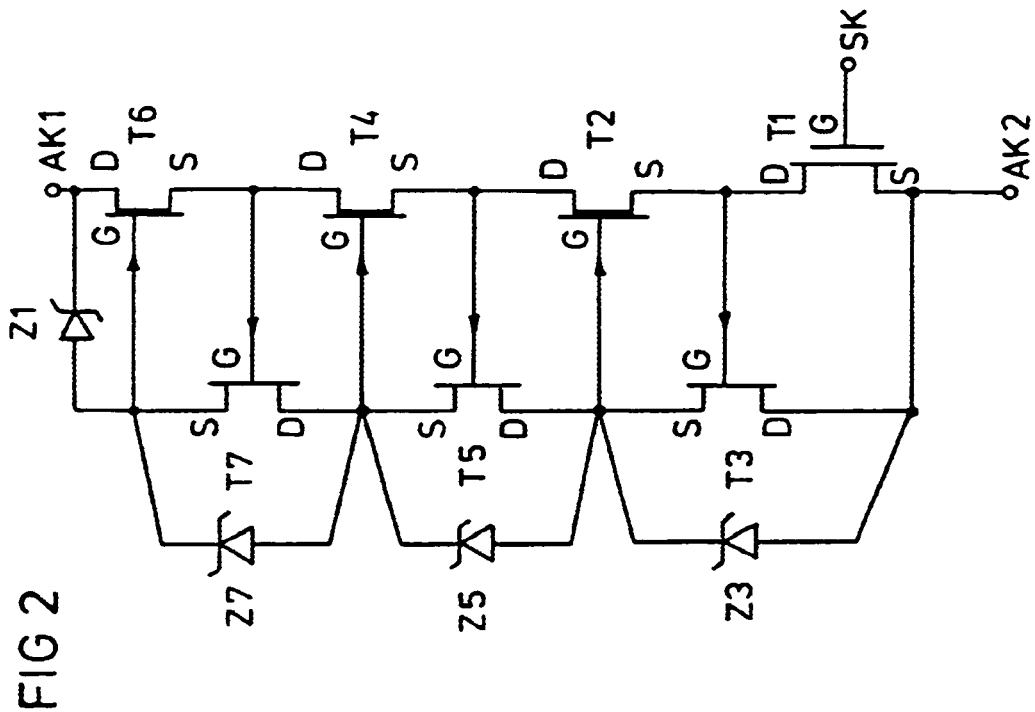
FIG. 2 is a schematic circuit diagram of a second embodiment of the power switch according to a second embodiment of the invention.

Referring now to FIG. 2, there is shown a further exemplary embodiment of a power switch according to the invention. The second embodiment differs from the first embodiment of FIG. 1 by the fact that further limiting transistors T4, T6 are connected in series with the limiting transistor T2. In order to set the gate potentials of the second and third limiting transistors T4, T6, a second and third auxiliary transistor T5, T7 are provided, the load path of the second auxiliary transistor T5 being connected up between the gate electrodes G of the first limiting transistor T2 and of the second limiting transistor T4, and the load path of the third auxiliary transistor T7 being connected up between the gate electrodes G of the second limiting transistor T4 and of the third limiting transistor T6. Further Zener diodes Z5, Z7 are respectively connected in parallel with the load paths of the second and third auxiliary transistors T5, T7. The source electrode of the auxiliary transistor T7 is connected to the first connecting terminal AK1 via the first Zener diode Z1.

The dielectric strength of the power switch can be increased by cascading further limiting transistors T4, T6 and further auxiliary transistors T5, T7. When the MOSFET T1 turns off in the exemplary embodiment according to FIG. 2, the gate potential of the limiting transistor T2 rises until the breakdown voltage of the Zener diode Z3 is reached. The source potential of the limiting transistor T2 then also rises until the gate-source reverse voltage is reached and the limiting transistor T2 turns off. As a result, the voltage across the load path of the limiting transistor T2 rises, and the source potential of the second limiting transistor T4 connected in series with said limiting transistor T2 rises. The associated auxiliary transistor T5 starts to turn off and allows the gate potential of the second auxiliary transistor T5 to rise until the breakdown voltage of the parallel-connected Zener diode Z5 is reached. The source potential of the second limiting transistor T4 then also rises until the latter's reverse voltage is reached and the limiting transistor T4 turns off and thereby prevents a further voltage rise across the load path of the limiting transistor T2. If the second limiting transistor T4 turns off, the source potential of the third limiting transistor T6 rises and, via the third auxiliary transistor T7, the latter's gate potential rises, until the breakdown voltage of the Zener diode Z7 is reached and, after a further rise in the source potential, the third limiting transistor T6 turns off and thus prevents a further rise in the load path voltage of the second limiting transistor T4. The difference in the voltage between a supply voltage V+ and the voltage already dropped across the load paths of the MOSFET T1 and of the limiting transistors T2, T4 is accepted by the third limiting transistor. The limiting transistors T2, T4, T6 turn off one after the other, proceeding from the first limiting transistor T2, in which case some of the limiting transistors can also remain in the on state if the voltage present between the connecting terminals AK1, AK2 is already accepted by the other limiting transistors. The number of limiting transistors T2, T4, T6 to be connected in series can be chosen in a manner dependent on the voltage to be switched. As many limiting transistors T2, T4, T6 as desired can be connected in series, and can be driven by auxiliary transistors T3, T5, T7 connected up correspondingly.

The power switch according to the invention has been described in FIGS. 1 and 2 using n-conducting transistors as limiting transistors and p-conducting transistors as auxiliary transistors. It goes without saying that it is also possible to use p-conducting transistors as limiting transistors and n-conducting transistors as auxiliary transistors, in which case it is then necessary to interchange the polarities of the Zener diodes.

Figure 3:
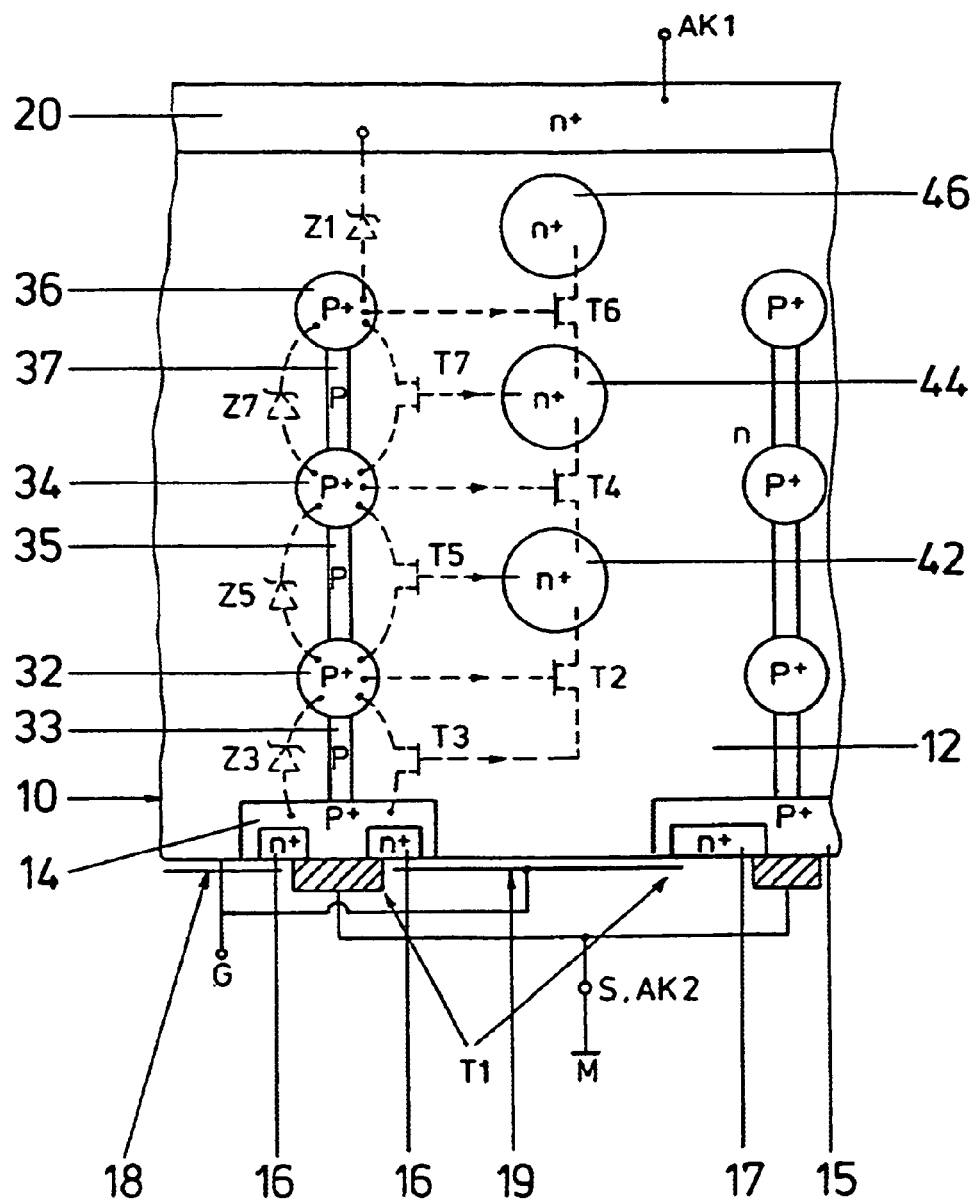
FIG. 3 sectional view through shows a semiconductor body in cross section with an integrated power switch according to the invention.

Referring now to FIG. 3, there is shown a cross section through a detail of a semiconductor body 10, in which a power switch according to the invention is integrated. The semiconductor body 10 has a substrate 12, which is n-conducting in the exemplary embodiment. One or more heavily p-doped wells 14, 15 are introduced into the substrate from one side of the semiconductor body, in which wells, in turn, heavily n-doped wells 16, 17 are formed. The p-doped wells 14, 15 with the n-doped wells are each part of cells of a MOSFET T1 formed in the semiconductor body 10. The heavily n-doped wells 16, 17 constitute the source regions of the MOSFET T1, which can be contact-connected externally via a metalization layer or a polysilicon and form the first connecting terminal AK1 of the power switch. Arranged such that they are isolated from the semiconductor body 10 by an insulation layer are gate electrodes 18, 19, which extend in the horizontal direction in each case from the heavily n-doped wells 16, 17 as far as the n-doped substrate 12 and are connected together to form a gate terminal G. That region of the substrate 12 which surrounds the p-doped wells 14, 15 forms the drain region of the MOSFET T1.

The substrate 12 is heavily n-doped in a region 20, which is opposite to the surface at which the MOSFET T1 is formed. This region forms the first connecting terminal AK1 of the power switch.

In the illustrated example, heavily p-doped regions 32, 34, 36 are arranged successively in the vertical direction between the cells of the MOSFET T1 and the region 20, respectively adjacent regions 32, 34; 34, 36 and the region 32 and the p-doped well 14 being connected to one another by weakly p-doped tracks 33, 35, 37. Heavily n-doped regions 42, 44, 46 are arranged such that they are spaced apart from the p-doped regions 32, 34, 36 in the horizontal direction, and are arranged such that they are respectively adjacent to one another in the vertical direction. There is a corresponding structure situated above the well 15, the structure only being partially illustrated, and without reference symbols. A multiplicity of such structures are preferably formed in the semiconductor body 10.

Such a structure may be fabricated e.g. by multilayer epitaxial deposition with ion implantation on the intermediate surfaces and outdiffusion from the implanted regions. The heavily p-doped regions 32, 34, 36, the heavily n-doped regions 42, 44, 46 and the p-doped tracks 33, 35, 37 may be diffused zones with non-uniform doping. The substrate 12 need not be doped uniformly either.

The p-doped regions 32, 34, 36 and the n-doped regions 42, 44, 46 form limiting transistors T2, T4, T6 and auxiliary transistors T3, T5, T7 with parallel Zener diodes Z3, Z5, Z7 with the circuitry connections illustrated in FIG. 2. In order to provide a better understanding, the circuit symbols of the limiting transistors T2, T4, T6, of the auxiliary transistors T3, T5, T7 and of the Zener diodes Z3, Z5, Z7 are portrayed by broken lines with the corresponding reference symbols in FIG. 3. As is illustrated in FIG. 3, the heavily p-doped regions 32, 34, 36 constitute the drain and source regions of the auxiliary transistors T3, T5, T7, the gate regions of the limiting transistors T3, T5, T7 and the anode and cathode regions of the Zener diodes Z3, Z5, Z7. Furthermore, the heavily n-doped well 14 forms the drain region of the auxiliary transistor T3.

The heavily n-doped regions 42, 44, 46 form the drain and source regions of the limiting transistors T2, T4, T6 and the gate regions of the limiting transistors T3, T5, T7.

If, in order to "close" the switch, a positive voltage is applied between the gate electrode G and the source electrode S of the MOSFET T1, a conduction region forms in the heavily p-doped wells 14, 15 and, in the event of a voltage being applied between the first and second connecting terminals AK1, AK2, a current flows from the first connecting terminal AK1 via the region 20, the substrate 12, the p-doped well 14 and the n-doped well 16 to the second connecting terminal AK2.

If the MOSFET T1 turns off, for example as a result of short-circuiting of the gate and source electrodes G, S with voltage present between the connecting terminals AK1, AK2, a space charge zone starts to build up in the substrate 12 proceeding from the MOSFET T1. If the space charge zone reaches the p-doped regions 32, 34, 36 in succession, positive potentials are established there, as a result of which charge carriers are bound around the p-doped regions 32, 34, 36 and, in particular, current can no longer flow between the heavily n-doped regions 42, 44, 46. The power switch turns off.

We claim:

1. A power switch, comprising:
   a controllable transistor having a load path and a control electrode;
   a first limiting transistor for limiting a voltage drop across said load path of said first transistor, said first limiting transistor having a load path connected in series with said load path of said controllable transistor, and having a control electrode;
   at least one second limiting transistor having a load path connected in series with said load path of said first limiting transistor;
   a first auxiliary transistor having a load path connected between said control electrode of said first limiting transistor and a reference node, and having a control electrode connected between said controllable transistor and said first limiting transistor;
   at least one second auxiliary transistor having a load path connected between said control electrode of said first limiting transistor and said control electrode of said second limiting transistor; and
   a control electrode connected between said load paths of said first and second limiting transistors.

2. The power switch according to claim 1, wherein said load path of said controllable transistor is connected between said limiting transistor and said reference node.

3. The power switch according to claim 1, which further comprises a power switch control terminal connected to said control electrode of said controllable transistor.

4. The power switch according to claim 1, wherein each of said first and at least one second limiting transistors has a source electrode and a gate electrode, and a Zener diode is connected between said source electrode and said gate electrode of each said limiting transistor.

5. The power switch according to claim 1, which comprises Zener diodes connected in parallel with said load paths of each said auxiliary transistor.

6. The power switch according to claim 1, wherein said controllable transistor is a MOSFET of a first conductivity type, said first and second limiting transistors are normally on field-effect transistors of the first conductivity type, and said first and second auxiliary transistors are normally on field-effect transistors of a second conductivity type.

7. The power switch according to claim 1, wherein said controllable transistor, said first and second limiting transistors, and said first and second auxiliary transistors are integrated in a semiconductor body.

8. A semiconductor configuration, comprising:
   a semiconductor body and a power switch formed in said semiconductor body and having a load path running vertically through said semiconductor body;
   a semiconductor body formed with:
     a substrate doped with charge carriers of a first conductivity type;
     at least one well doped with charge carriers of a second conductivity type, and a MOSFET formed in said at least one well;
     a first region formed in said substrate spaced apart from said well and heavily doped with charge carriers of the first conductivity type; and
     a second region horizontally spaced apart from said first region and heavily doped with charge carriers of a second conductivity type; and
   a power switch according to claim 1 formed in said semiconductor body and having a load path running vertically through said semiconductor body.

9. The semiconductor body according to claim 8, wherein said first region is one of a plurality of first regions formed in said semiconductor body and spaced apart from one another in the vertical direction, and said second region is one of a plurality of second regions formed in said semiconductor body and spaced apart from one another in the vertical direction.

10. The semiconductor body according to claim 9, which comprises interconnects connecting respectively adjacent second regions, said interconnects being formed by doping with charge carriers of the second conductivity type, and wherein said well is connected to one of said second regions by an interconnect.

* * * * *